(12) United States Patent
Egawa (10) Patent No.: US 7,830,929 B2
(45) Date of Patent: Nov. 9, 2010

(54) LASER BEAM SOURCE DEVICE, LIGHTING DEVICE, IMAGE DISPLAY APPARATUS, AND MONITORING APPARATUS

(75) Inventor: Akira Egawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 98 days.

(21) Appl. No.: 12/366,489

(22) Filed: Feb. 5, 2009

(65) Prior Publication Data

US 2010/0040093 A1 Feb. 18, 2010

(30) Foreign Application Priority Data

Feb. 5, 2008 (JP) .............................. 2008-025646

(51) Int. Cl.
*H01S 3/10* (2006.01)
(52) U.S. Cl. .............................. 372/22; 372/21; 372/99; 372/107; 372/108
(58) Field of Classification Search ............. 372/21–22, 372/99, 107
See application file for complete search history.

(56) References Cited

U.S. PATENT DOCUMENTS 7,359,420 B2 * 4/2008 Shchegrov et al. ...... 372/50.124

2009/0225797 A1 * 9/2009 Kuhnelt et al. ................ 372/22
2009/0279574 A1 * 11/2009 Gapontsev .................... 372/21

FOREIGN PATENT DOCUMENTS

JP 59-128525 A 7/1984

OTHER PUBLICATIONS

Aram Mooradian et al; High Power Extended Vertical Cavity Surface Emitting Diode Lasers and Arrays and Their Applications; Micro-Optics Conference, Tokyo Japan, Nov. 2, 2005.

* cited by examiner

*Primary Examiner*—Dung T Nguyen
(74) *Attorney, Agent, or Firm*—Workman Nydegger (57) ABSTRACT

A laser beam source device includes: a light source which emits light having fundamental wavelength; a wavelength conversion element which converts the light having fundamental wavelength into light having conversion wavelength; a resonance element which transmits first light converted into the conversion wavelength light and reflects light not converted; an optical path conversion element which releases second light contained in the light reflected by the resonance element and converted into the conversion wavelength light in the same direction as the direction of the first light, and releases the light not converted toward the light source; and a supporting member. The resonance element is disposed in such a position that one end surface of the resonance element on the second light side is shifted to the supporting member from one end surface of the wavelength conversion element on the second light side.

8 Claims, 8 Drawing Sheets

LASER BEAM SOURCE DEVICE, LIGHTING DEVICE, IMAGE DISPLAY APPARATUS, AND MONITORING APPARATUS

BACKGROUND

1. Technical Field

The present invention relates to a laser beam source device, a lighting device, an image display apparatus, and a monitoring apparatus.

2. Related Art

Recently, a laser beam source device has been widely used in the field of light communication, light application measurement, light display, and other optoelectronics fields. The laser beam source device is divided into the type using wavelength of fundamental laser beam without change, and the type converting wavelength of fundamental laser beam before use. The latter type of the laser beam source device includes a wavelength conversion element for converting the wavelength of fundamental laser, for example. The wavelength conversion element is called second harmonic generation (SHG) element.

Generally, the conversion efficiency of the SHG is about 30 to 40%, and therefore the power of light converted by the SHG element is extremely smaller than the power of output light from the fundamental laser beam source. JP-A-59-128525 proposes a laser beam source device which has a structure for reducing power decrease of the output light. According to this laser beam source device, light emitted from an inside resonance type laser beam source passes through the SHG element. Then, the light is divided into first SHG light having converted wavelength and remaining fundamental light. Subsequently, the remaining fundamental light again passes through the SHG element to obtain second SHG light having converted wavelength. The second SHG light is combined with the first SHG light after converted into polarized light having polarization direction different from that of the first SHG light by 90 degrees. By this method, the laser beam source device according to JP-A-59-128525 reduces power decrease of the output light by using the combined light of the first SHG light and the second SHG light as the output light.

According to the laser beam source device described in JP-A-59-128525, the remaining fundamental light again passes through the SHG element to use the second SHG light after wavelength conversion. It is difficult, however, to use the remaining fundamental light which has wavelength not converted even after again passing through the SHG element. In this case, the use efficiency of light does not dramatically increase. Moreover, when this remaining fundamental light is returned to the fundamental laser beam source without change, there is a possibility that the power of the fundamental laser beam source decreases or becomes unstable. In this case, such a structure which prevents return of the remaining fundamental light to the light source is required, and thus the size of the optical system becomes larger. In addition, the length of the optical path increases or light needs to pass through the optical elements a larger number of times, which produces loss of light.

When the laser beam source device is combined with a liquid crystal device, a diffusion optical member for diffusing light from the laser beam source device is required. Light supplied to the liquid crystal device via a large-sized diffusion optical member has low image formability. Thus, compactness of the diffusion optical member is demanded.

SUMMARY

It is an advantage of some aspects of the invention to provide a laser beam source device, a lighting device, an image display apparatus, and a monitoring apparatus, capable of increasing light utilization efficiency and reducing size of an optical member disposed downstream.

A laser beam source device according to a first aspect of the invention includes: a light source which emits light having fundamental wavelength; a wavelength conversion element which receives the light having fundamental wavelength and emitted from the light source and converts at least a part of the received light into light having predetermined conversion wavelength; a resonance element which transmits first light converted into the predetermined conversion wavelength light and reflects light not converted into the predetermined conversion wavelength toward the wavelength conversion element; an optical path conversion element which releases second light contained in the light reflected by the resonance element and converted into the predetermined conversion wavelength light by passing through the wavelength conversion element substantially in the same direction as the direction of the first light transmitted through the resonance element, and releases the light not converted into the predetermined conversion wavelength light toward the light source; and a supporting member which supports the wavelength conversion element, the resonance element, and the optical path conversion element on one end surface of the supporting member. The resonance element is disposed in such a position that one end surface of the resonance element on the second light side is shifted to the supporting member from one end surface of the wavelength conversion element on the second light side.

According to the laser beam source device of this aspect of the invention, light emitted from the light source enters the wavelength conversion element, and at least a part of the light is converted to the predetermined conversion wavelength light. The first light converted into the predetermined conversion wavelength light by the wavelength conversion element passes through the resonance element.

On the other hand, the light not converted into the predetermined conversion wavelength light by the wavelength conversion element is reflected by the resonance element and again passes through the wavelength conversion element. Then, the light not converted into the predetermined conversion wavelength light while passing the wavelength conversion element is guided to the light source by the optical path conversion element. The light emitted from the light source is resonated between the light source and the resonance element and is amplified. The optical path of the second light converted into the predetermined conversion wavelength while again passing through the wavelength conversion element is bended by the optical path conversion element substantially in the same direction as that of the first light transmitted through the resonance element.

The resonance element is disposed in such a position that one end surface of the resonance element on the second light side is shifted to the supporting member from one end surface of the wavelength conversion element on the second light side. In this arrangement, the second light whose optical path is bended by the optical path conversion element diffuses in the traveling direction. However, the first light and the second light can be directed to come close to one another while preventing the second light from being applied to the resonance element disposed away from the light source. Thus, utilization efficiency of light improves, and the size of an optical element disposed downstream from the laser beam source device can be reduced.

It is preferable that the optical path conversion element includes: a separating unit disposed between the light source and the wavelength conversion element on the optical path to release the second light contained in the light reflected by the resonance element in a direction different from the direction toward the light source, and release the remaining light not converted into the predetermined conversion wavelength light toward the light source; and a reflecting unit which reflects the second light released from the separating unit substantially in the same direction as the direction of the first light transmitted through the resonance element.

According to this structure, the second light reflected by the resonance element and converted into the predetermined conversion wavelength light by passing through the wavelength conversion element can be released in a desired direction by the separating unit and the reflecting unit. Thus, the second light can be easily released substantially in the same direction as that of the first light.

Moreover, the second light can be directed toward the first light by controlling the reflecting unit. Thus, the light converted into the predetermined conversion wavelength light by the wavelength conversion element can be efficiently supplied to the optical element by controlling the reflecting unit according to the size of the optical element disposed downstream from the laser beam source device.

It is preferable that the wavelength conversion element is disposed in such a position that the one end surface of the wavelength conversion element is shifted to the supporting member from the end portion of the separating unit closest to the light source.

According to this structure, the wavelength conversion element is disposed in such a position that the one end surface of the wavelength conversion element is shifted to the supporting member from the end portion of the separating unit closest to the light source. That is, the end portion of the separating unit, the one end surface of the wavelength conversion element, and the one end surface of the resonance element are disposed on the supporting member in this order. In this arrangement, the second light whose optical path is bended by the optical path conversion element diffuses in the traveling direction. However, the second light is prevented from being applied to the wavelength conversion element as well as the resonance element. Thus, utilization efficiency of light improves, and the size of an optical element disposed downstream from the laser beam source device can be reduced.

It is preferable that the areas on the end surfaces of the optical path conversion element, the wavelength conversion element, and the resonance element for receiving light emitted from the light source decrease in the order of optical path conversion element, the wavelength conversion element, and the resonance element.

According to this structure, the areas on the end surfaces of the optical path conversion element, the wavelength conversion element, and the resonance element for receiving light emitted from the light source decrease in the order of optical path conversion element, the wavelength conversion element, and the resonance element. In this arrangement, the optical path conversion element, the wavelength conversion element, and the resonance element are made compact. Thus, cost reduction can be achieved.

It is preferable that the laser beam source device further includes a wavelength selection element disposed between the optical path conversion element and the wavelength conversion element on the optical path to transmit light contained in the light released from the optical path conversion element and having predetermined selection wavelength. In this case, the wavelength selection element is disposed in such a position that one end surface of the wavelength selection element is shifted to the supporting member from the end portion of the separating unit closest to the light source.

According to this structure, predetermined selection wavelength light contained in the light emitted from the light source is transmitted by passing through the wavelength selection element. By this method, the spectrum of the oscillation wavelength of light reciprocating between the light source and the resonance element is limited. Thus, light having desired wavelength can be emitted in a stable manner.

Moreover, the wavelength selection element is disposed in such a position that one end surface of the wavelength selection element is shifted to the supporting member from the end portion of the separating unit closest to the light source. In this arrangement, the second light whose optical path is bended by the optical path conversion element diffuses in the traveling direction. However, the second light is prevented from being applied to the wavelength selection element. Thus, utilization efficiency of light more securely improves even when the wavelength selection element is used. Accordingly, the size of an optical element disposed downstream from the laser beam source device can be reduced.

A lighting device according to a second aspect of the invention includes: the laser beam source device described above; and a diffusion optical member disposed in the traveling direction of laser beam emitted from the laser beam source device.

The lighting device according to the second aspect of the invention includes the laser beam source device described above. Thus, the size of the diffusion optical member is reduced, and the emitted laser beam has high image formability and high performance.

An image display apparatus according to a third aspect of the invention includes: the laser beam source device described above; and an image forming device which displays an image having desired size on a display surface by using light emitted from the laser beam source device.

According to the image display apparatus of this aspect of the invention, laser beam emitted from the laser beam source device enters the image forming device. Then, an image formed by the image forming device is displayed on the display surface. In this case, the light emitted from the light source device is high-power laser beam. Thus, the displayed image becomes bright and clear image.

A monitoring apparatus according to a fourth aspect of the invention includes: the laser beam source device described above; and an image pickup unit which shoots an image of a subject by using laser beam emitted from the laser beam source device.

According to the monitoring apparatus of this aspect of the invention, the subject is illuminated by laser beam emitted from the laser beam source device, and the image of the subject is shot by using the image pickup unit. In this case, the light emitted from the light source device is high-power laser beam as described above. Thus, the subject is illuminated by bright light, and the image obtained by the image pickup unit becomes clear image.

BRIEF DESCRIPTION OF THE DRAWINGS

The invention will be described with reference to the accompanying drawings, wherein like numbers reference like elements.

DESCRIPTION OF EXEMPLARY EMBODIMENTS

A laser beam source device, a lighting device, an image display apparatus, and a monitoring apparatus according to exemplary embodiments of the invention are hereinafter described with reference to the drawings. The scale is varied for each figure so that respective components in the figures can be easily recognized.

First Embodiment

Figure 1:
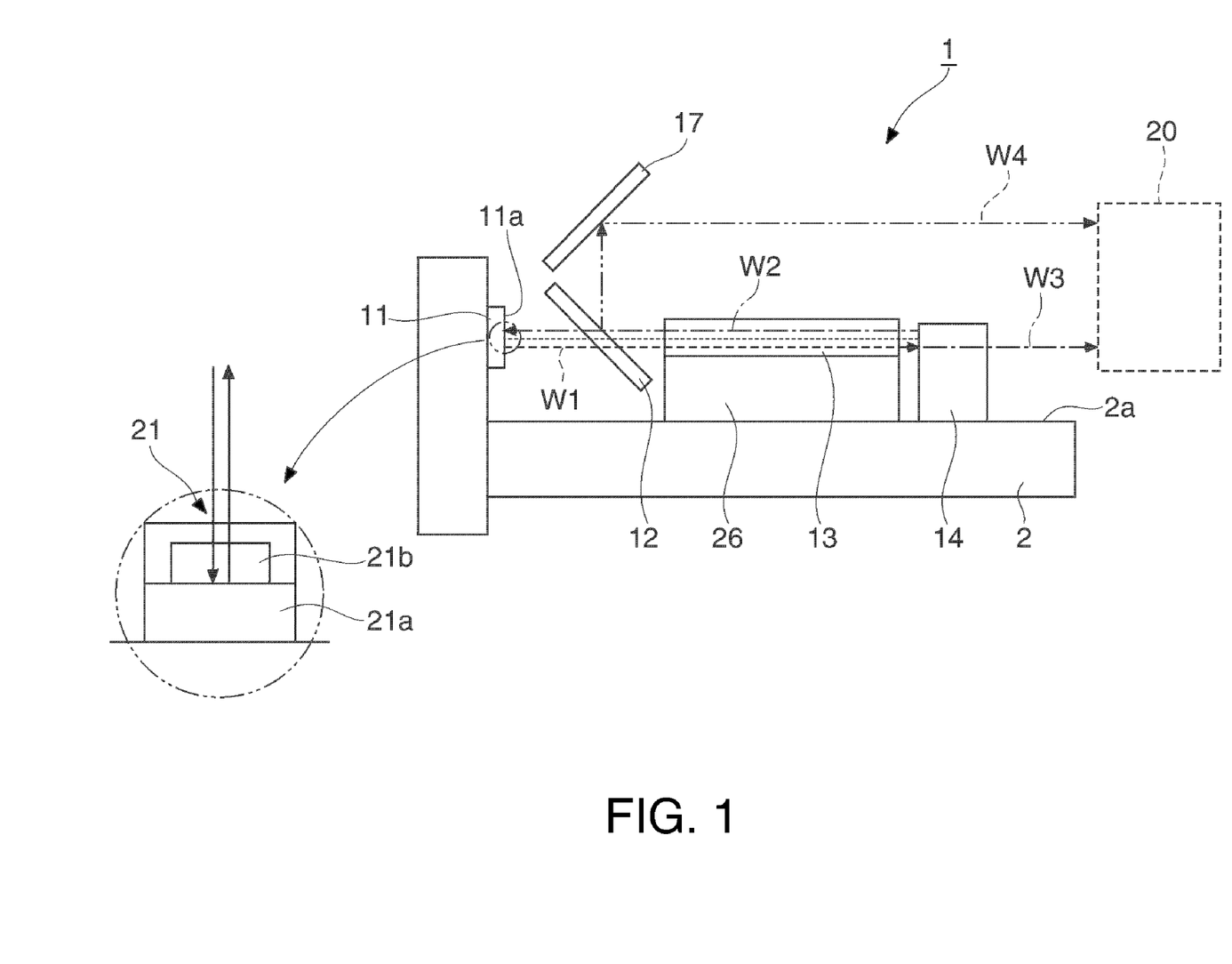
FIG. 1 is a plan view showing a laser beam source device according to a first embodiment of the invention.

A laser beam source device 1 according to this embodiment converts light emitted from a laser beam source 11 into laser beam having predetermined conversion wavelength, and supplies the laser beam after conversion to a rod integrator (optical element) 20. More specifically, the laser beam source device 1 includes a laser beam source (light source) 11 having an emitter 21 for emitting laser beam, a dichroic mirror (separating unit, optical path conversion element) 12, a wavelength conversion element 13, an external resonance mirror (resonance element) 14, and a reflection mirror (reflecting unit, optical path conversion element) 17 as illustrated in FIG. 1. The dichroic mirror 12, the wavelength conversion element 13, and the external resonance mirror 14 are mounted on an upper surface (one end surface) 2a of a supporting substrate (supporting member) 2.

The laser beam source 11 is a face light emission type laser diode which emits infrared laser beam having wavelength of 1,065 nm (fundamental wavelength light) from an emission end surface 11a, for example. The emitter 21 is formed by laminating an active layer 21b on a DBR (distributed Bragg reflector) layer 21a as illustrated in the enlarged view in FIG. 1.

The wavelength conversion element 13 is constituted by PPLN (periodically poled lithium niobate) as a non-linear optical element, which functions as an SHG element for converting entering light into light having substantially half wavelength and generating second harmonic waves.

As illustrated in FIG. 1, a part of light W1 emitted from the laser beam source 11 is converted into green laser beam having substantially half wavelength (530 nm) as predetermined conversion wavelength light by passing through the wavelength conversion element 13.

The wavelength conversion element 13 is mounted on a temperature control substrate 26 disposed on the supporting substrate 2. A thermister (not shown) for controlling temperature of the wavelength conversion element 13 and a heater (not shown) are provided on the temperature control substrate 26. The refractive index inside the wavelength conversion element 13 varies according to temperature change. Thus, the wavelength conversion element 13 is heated by the heater according to the temperature of the wavelength conversion element 13 detected by the thermister. Since the temperature of the wavelength conversion element 13 is adjusted to an appropriate temperature by the temperature control substrate 26 in this manner, the laser beam emitted from the laser beam source 11 can be efficiently converted into higher wave leaser beam having the predetermined conversion wavelength.

The external resonance mirror 14 functions as a resonance mirror of the laser beam source 11 by selecting laser beam W2 (indicated by dashed line in FIG. 1) contained in the light released from the wavelength conversion element 13 and not converted into the predetermined conversion wavelength light and reflecting the selected laser beam toward the laser beam source 11. The external resonance mirror 14 also transmits light W3 (first light, indicated by alternate long and two short dashed line in FIG. 1) converted into the predetermined conversion wavelength light.

The dichroic mirror 12 is disposed between the laser beam source 11 and the wavelength conversion element 13 on the optical path. The dischroic mirror 12 reflects laser beam having predetermined conversion wavelength in a direction different from the direction toward the laser beam source 11, and transmits laser beam not converted into predetermined conversion wavelength light toward the laser beam source 11. The reflection surface of the dichroic mirror 12 is disposed in such a position for receiving the laser beam reflected by the external resonance mirror 14 at the angle of 45 degrees. Thus, the laser beam converted into the predetermined conversion wavelength light is bended by 90 degrees by the dichroic mirror 12. The dichroic mirror 12 increases transmission rate of P-polarized light to a value higher than that of S-polarized light so that resonance by P-polarized light can be achieved.

The reflection mirror 17 reflects the laser beam having the predetermined conversion wavelength and reflected by the dichroic mirror 12 toward the rod integrator 20. The reflection surface of the reflection mirror 17 is disposed in such a position for receiving the laser beam reflected by the dichroic mirror 12 at 45 degrees. By disposing the dichroic mirror 12 and the reflection mirror 17 such that the angle formed by these mirrors 12 and 17 becomes 90 degrees, the optical path of the laser beam W2 reflected by the external resonance mirror 14 is bended by 180 degrees. As a result, laser beam (second light) W4 reflected by the reflection mirror 17 becomes substantially parallel with the laser beam W3 released from the external resonance mirror 14.

The reflection mirror 17 is disposed close to the dichroic mirror 12 such that the laser beam W4 reflected by the reflection mirror 17 comes close to the laser beam W3 transmitted through the external resonance mirror 14.

For directing the laser beam W4 close to the laser beam W3, the reflection mirror 17 may be disposed in such a position that the angle formed by the reflection mirror 17 and the dichroic mirror 12 becomes an angle smaller than 90 degrees. By directing the laser beam W3 and the laser beam W4 close to each other, the size of the rod integrator 20 disposed downstream can be reduced.

The dichroic mirror 12 and the reflection mirror 17 are fixed to the supporting substrate 2 by a not-shown fixing member.

Figure 2:
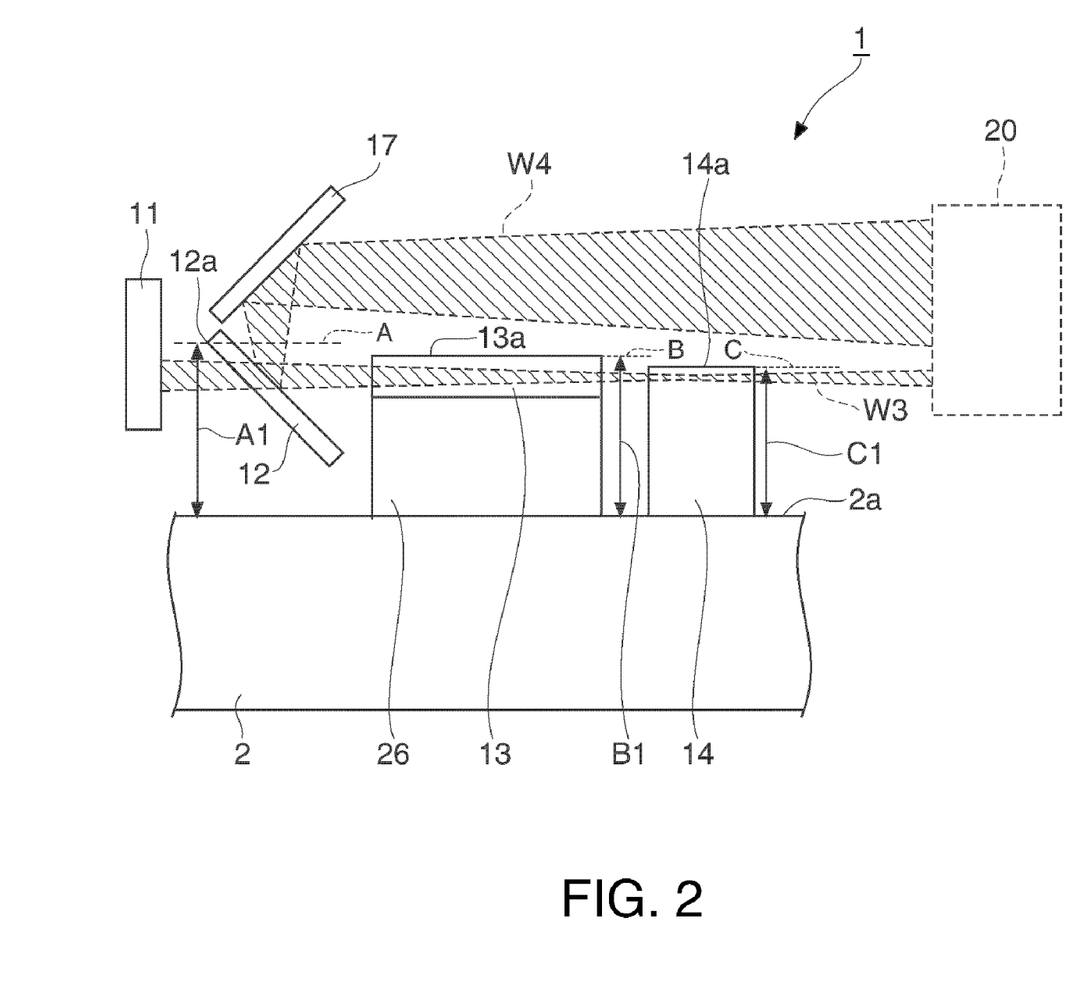
FIG. 2 is an enlarged cross-sectional view of the laser beam source device shown in FIG. 1.

As illustrated in FIG. 2, laser beam emitted from the laser beam source 11 is converged by the thermal lens effect of the laser beam source 11, and becomes light generally represented as Gaussian beam. The external resonance mirror 14 is disposed at the position of beam waist. In this arrangement, the reflection efficiency of the external resonance mirror 14 becomes the maximum, and the utilization efficiency of the laser beam emitted from the laser beam source 11 improves.

The external resonance mirror 14 is constituted by VHG (volume holographic grating). An upper surface (one end surface) 14a of the external resonance mirror 14 on the laser beam W4 side is shifted toward the supporting substrate 2 from an upper surface (one end surface) 13a of the wavelength conversion element 13 on the laser beam W4 side. The external resonance mirror 14 is disposed such that the laser beam emitted from the wavelength conversion element 13 passes on the upper surface 14a side. The wavelength conversion element 13 is shifted toward the supporting substrate 2 from an end portion 12a of the dichroic mirror 12 closest to the laser beam source 11.

More specifically, assuming that the distances between the upper surface 2a of the supporting substrate 2 and a broken line A extended from the end portion 12a of the dichroic mirror 12 in the laser beam traveling direction, a broken line B extended from the upper surface 13a of the wavelength conversion element 13 in the laser beam traveling direction, and a broken line C extended from the upper surface 14a of the external resonance mirror 14 in the laser beam traveling direction are A1, B1, and C1, respectively, the distance A1 is the longest. Also, the distance B1 is longer than the distance C1.

As illustrated in FIG. 2, the light reflected by the external resonance mirror 14 diffuses toward the laser beam source 11. Thus, the laser beam reflected by the dichroic mirror 12 and the reflection mirror 17 diffuses accordingly.

Since the laser beam reflected by the reflection mirror 17 diffuses toward the rod integrator 20, the outermost portion of the laser beam W4 is inclined to the supporting substrate 2. The laser beam W4 reflected by the reflection mirror 17 is also positioned close to the laser beam W3 released from the external resonance mirror 14. Since the distances A1, B1 and C1 decrease in this order in the diffusion direction of the laser beam W4, the laser beam W4 reflected by the reflection mirror 17 does not reach the wavelength conversion element 13 and the external resonance mirror 14 but enters the rod integrator 20.

According to the laser beam source device 1 in this embodiment, therefore, the laser beam W4 whose optical path has been bent by the dichroic mirror 12 and the reflection mirror 17 diffuses in the traveling direction of the laser beam W4. However, the laser beam W3 and the laser beam W4 can be directed close to each other while the laser beam W4 is prevented from being supplied to the external resonance mirror 14 disposed at the longest distance from the laser beam source 11. Thus, the size of the rod integrator 20 disposed downstream from the laser beam source device 1 can be reduced.

According to this embodiment, the distances A1, B1, and C1 decrease in this order in the diffusing direction of the laser beam W4. Thus, the laser beam W4 reflected by the reflection mirror 17 can be securely prevented from being supplied to the wavelength conversion element 13 and the external resonance mirror 14. Accordingly, utilization efficiency of laser beam more securely improves.

Moreover, in the structure including the dichroic mirror 12 and the reflection mirror 17 as the optical path conversion element, the laser beam W4 converted into light having the predetermined conversion wavelength can be released in the desired direction by passing through the wavelength conversion element 13 after reflection by the external resonance mirror 14. By this method, the laser beam W4 and the laser beam W3 can be easily released substantially in the same direction.

Moreover, the laser beam W4 can be directed toward the laser beam W3 by controlling the angle formed by the reflection mirror 17 and the dichroic mirror 12 by adjustment of the reflection mirror 17. More specifically, the laser beam W4 converted into light having the predetermined conversion wavelength by the wavelength conversion element 13 can be efficiently supplied to the rod integrator 20 by controlling the incident angle of the laser beam entering the reflection mirror 17 according to the size of the rod integrator 20 disposed downstream from the laser beam source device 1.

The optical path conversion element is not limited to the structure having the dichroic mirror 12 and the reflection mirror 17.

The wavelength conversion element 13 is not required to be disposed in such a position that the upper surface 13a of the wavelength conversion element 13 is shifted toward the supporting substrate 2 from the end portion 12a of the dichroic mirror 12 closest to the laser beam source 11 depending on the diffusion of the laser beam reflected by the reflection mirror 17.

Modified Example of First Embodiment

Figure 3:
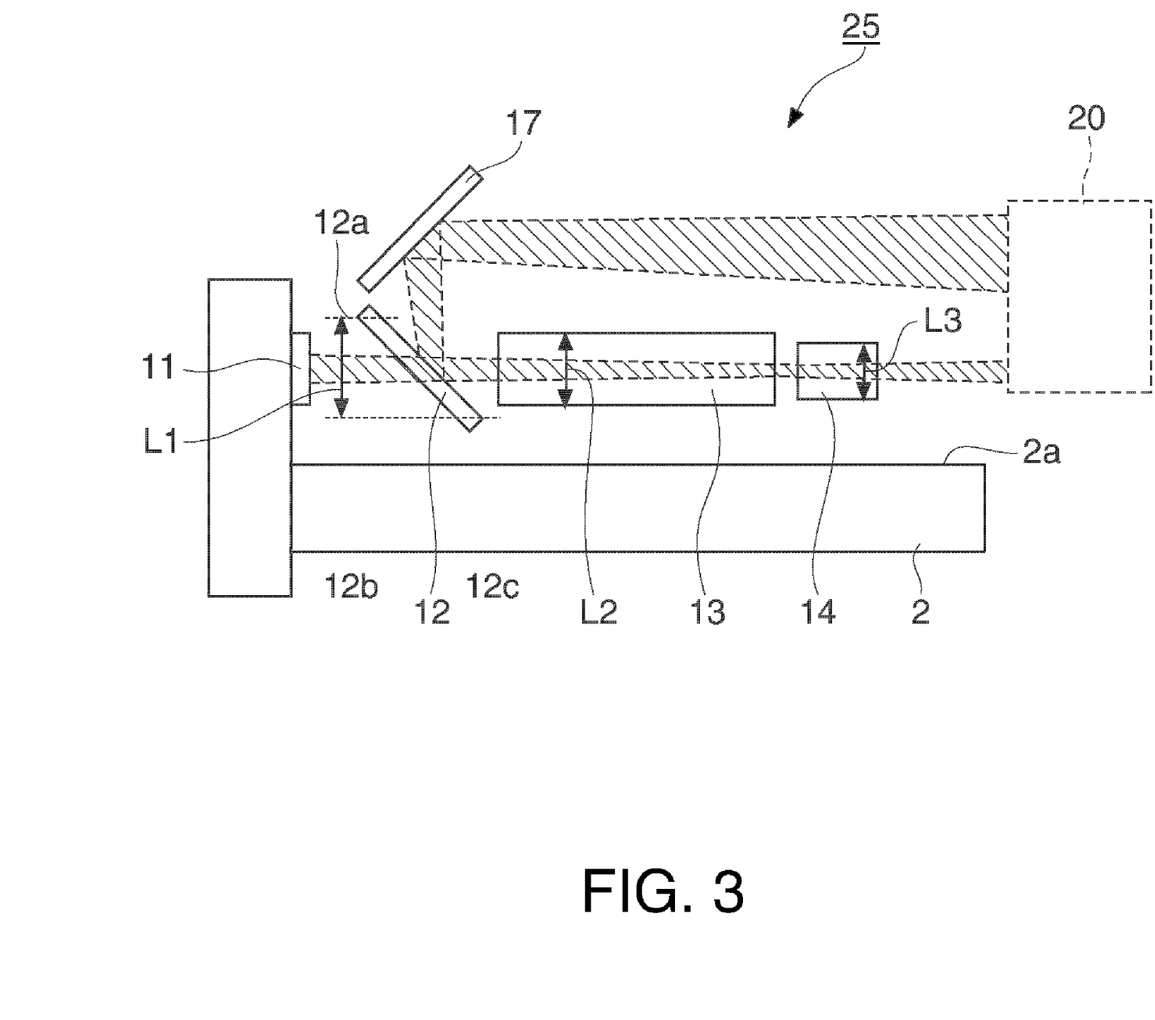
FIG. 3 is a plan view showing a modified example of the laser beam source device according to the first embodiment.

According to a laser beam source device 25 in this modified example, the size relationship between the entrance end surfaces of the dichroic mirror 12, the wavelength conversion element 13, and the external resonance mirror 14 is different from the size relationship between those components in the first embodiment. The modified example having this structure is now described with reference to FIG. 3. As illustrated in FIG. 3, the wavelength conversion element 13 and the external resonance mirror 14 are fixed to the supporting substrate 2 by a not-shown fixing member.

An area L1 for receiving laser beam is produced between the broken line A and a broken line Aa extended from an end portion 12c of the dichroic mirror 12 closest to the wavelength conversion element 13 in the traveling direction of the laser beam. An area L2 (effective area) is an area for receiving the laser beam on an entrance end surface 13b of the wavelength conversion element 13. An area L3 is an area for receiving laser beam (effective area) on an entrance end surface 14b of the external resonance mirror 14. The area L1 of the dichroic mirror 12, the area L2 of the wavelength conversion element 13, and the area L3 of the external resonance mirror 14 decreases in this order.

More specifically, the size of the area L2 of the wavelength conversion element 13 is smaller than the size of the area L1 of the dichroic mirror 12, but is sufficiently large for receiving the converged laser beam. Similarly, the size of the area L3 of the external resonance mirror 14 is smaller than the area L2 of the wavelength conversion element 13, but is sufficiently large for receiving the converged laser beam.

In this structure, laser beam emitted from the laser beam source 11 is converged by the thermal lens effect of the laser beam source 11, and the external resonance mirror 14 is disposed at the position of beam waist. Even in this structure having the areas L1, L2, and L3 decreased in this order, the laser beam emitted from the laser beam source 11 can sequentially enter the areas L1, L2, and L3. Thus, the sizes of the dichroic mirror 12, the wavelength conversion element 13, and the external resonance mirror 14 can be reduced while preventing loss of laser beam. Accordingly, cost reduction can be achieved.

Second Embodiment

A second embodiment according to the invention is now described with reference to FIG. 4. Similar reference numbers are given to parts similar to those of the laser beam source device 1 according to the first embodiment, and the same explanation is not repeated.

A laser beam source device 30 in this embodiment has the same structure as that of the laser beam source device 1 according to the first embodiment except that a BPF 31 is equipped on the laser beam source device 30.

Figure 4:
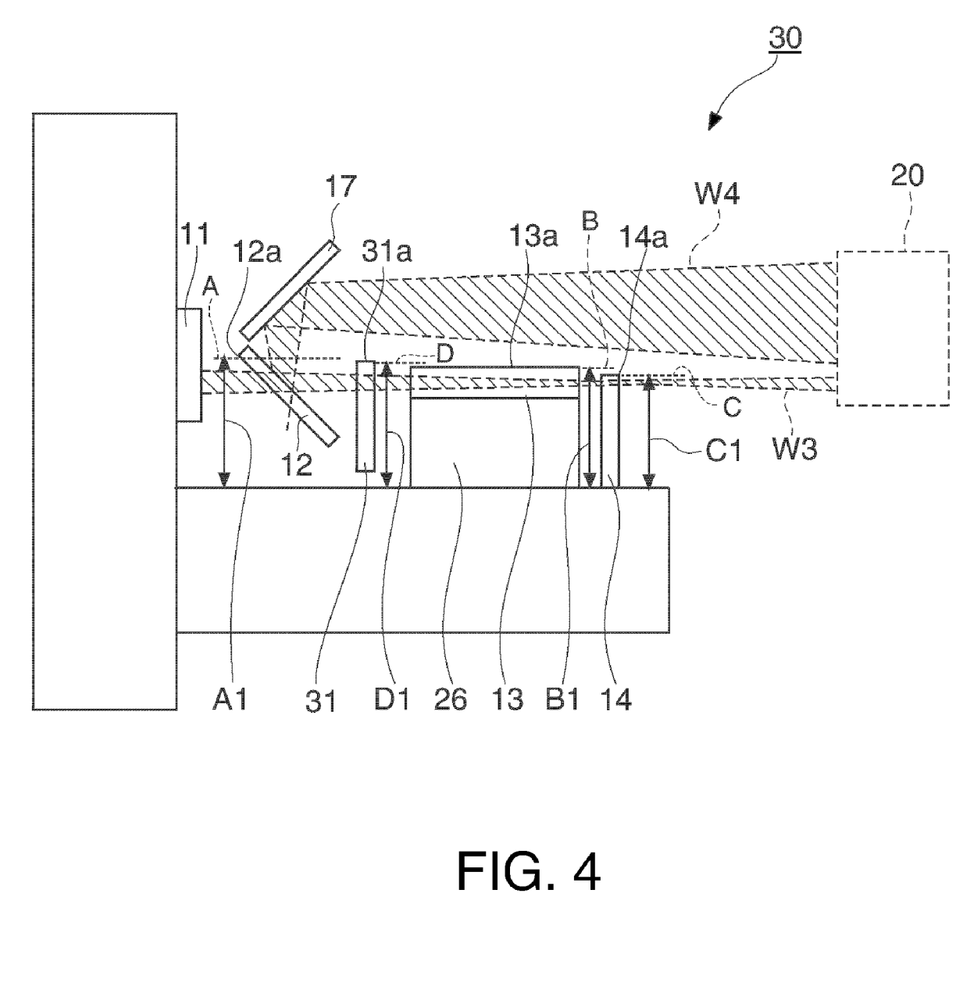
FIG. 4 is a plan view of a laser beam source device according to a second embodiment of the invention.

As illustrated in FIG. 4, the BPF (band-pass filter, wavelength selection element) 31 is disposed between the dichroic mirror 12 and the wavelength conversion element 13 on the optical path in the laser beam source device 30. The BPF 31 transmits laser beam having predetermined selection wavelength and contained in laser beam W1 emitted from the laser beam source 11 and transmitted through the dichroic mirror 12. By this method, the spectrum of the oscillation wavelength of the laser beam reciprocating between the laser beam source 11 and the external resonance mirror 14 is limited. The BPF 31 is fixed to the supporting substrate 2 by a not-shown fixing member.

The BPF 31 is disposed in such a position that an upper surface 31a of the BPF 31 is shifted to the supporting substrate 2 from the end portion 12a of the dichroic mirror 12 closest to the laser beam source 11. The BPF 31 is also disposed in such a position that the upper surface 31a of the BPF 31 is shifted to the side opposite to the supporting substrate 2 from the upper surface 13a of the wavelength conversion element 13.

More specifically, when the distance between the upper surface 2a of the supporting substrate 2 and a broken line D extended from the upper surface 31a of the BPF 31 in the traveling direction of the laser beam is D1, the distance A1 is the longest. In this case, the distances D1, B1, and C1 decrease in this order.

According to the laser beam source device 30 in this embodiment, the laser beam W4 reflected by the reflection mirror 17 diffuses in the traveling direction of the laser beam W4. However, the laser beam W4 is prevented from being supplied to the BPF 31, the wavelength conversion element 13, and the external resonance mirror 14. Thus, utilization efficiency of laser beam improves even when the BPF 31 is used. Accordingly, the size of the rod integrator 20 disposed downstream from the laser beam source device 30 can be reduced.

Third Embodiment

Figure 5:
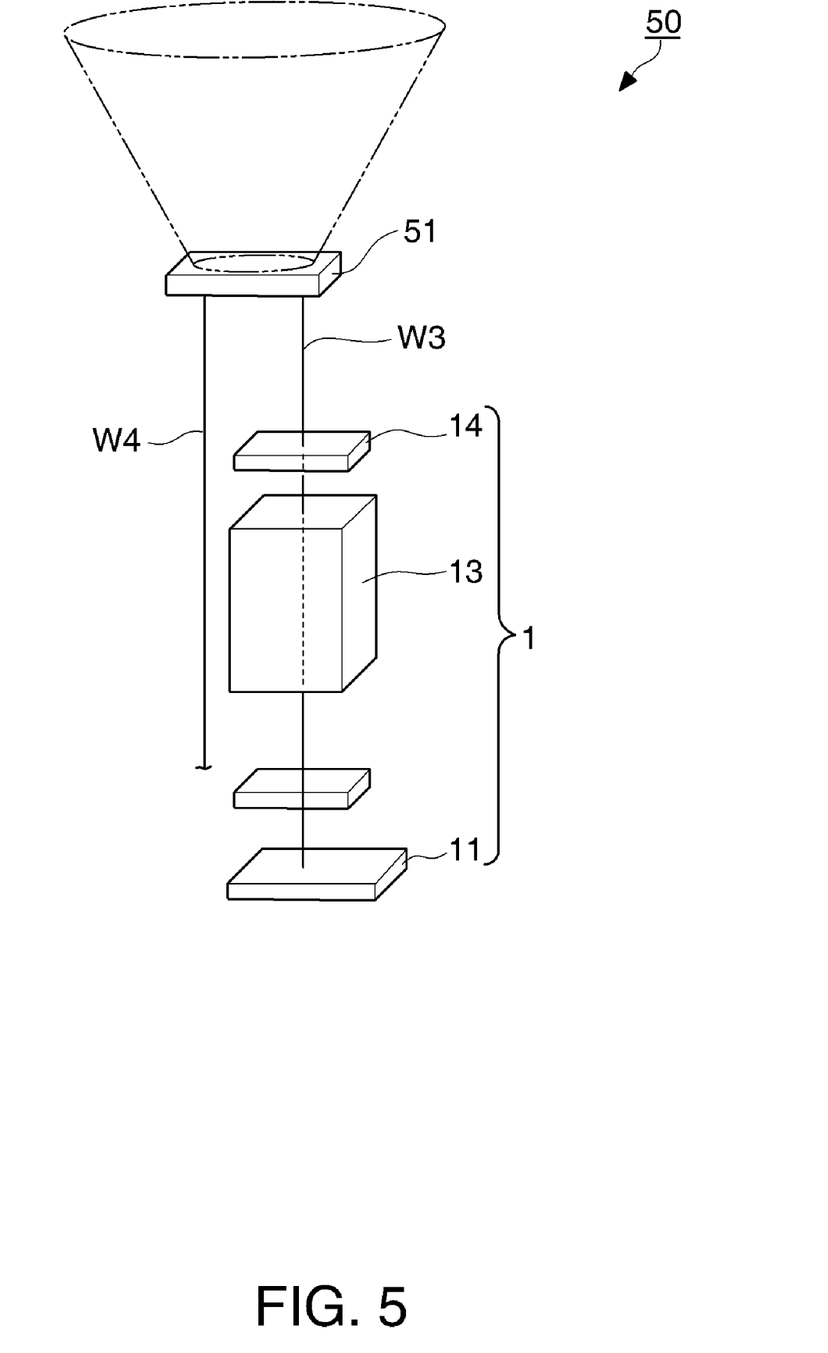
FIG. 5 is a plan view of a lighting device according to a third embodiment of the invention.

A structure example of a lighting device 50 applying the laser beam source device 1 as an embodiment of a lighting device according to the invention is how described. FIG. 5 schematically illustrates the lighting device 50. FIG. 5 is a simplified figure which does not show the dichroic mirror 12.

As illustrated in FIG. 5, the lighting device 50 includes the laser beam source device 1 described above, and a diffusion optical member 51 which diffuses laser beam emitted from the laser beam source device 1 and equalizes the illuminance distribution of the laser beam. The diffusion optical member 51 is constituted by hologram element. More specifically, a computer generated hologram (CGH) which forms interference strips artificially produced by calculator on a hologram plate is used. The computer generated hologram capable of freely setting division areas of diffractive grating is preferable since no aberration is caused.

Generally, unevenness of the diffusing optical member 51 constituted by the computer generated hologram is produced by manufacture error or the like. In this case, clear light is not obtained. This phenomenon becomes prominent particularly when the diffusion optical member 51 is large. Moreover, the compact diffusion optical member 51 has high image formability and provides light emission having clear and uniform illuminance distribution for the light receiving object. It is therefore desired that the diffusion optical member 51 is made compact.

According to the lighting device 50 in this embodiment including the laser beam source device, described above, the size of the diffusion optical member 51 is reduced, and the image formability of light is improved. Thus, the lighting device 50 has high performance capable of supplying light having sufficient clarity and uniform illuminance distribution to the light receiving object.

While the example of the lighting device including the laser beam source device 1 has been discussed, the lighting device may include the laser beam source device 25 according to the modified example of the first embodiment or the laser beam source device 30 according to the second embodiment.

Fourth Embodiment

Figure 6:
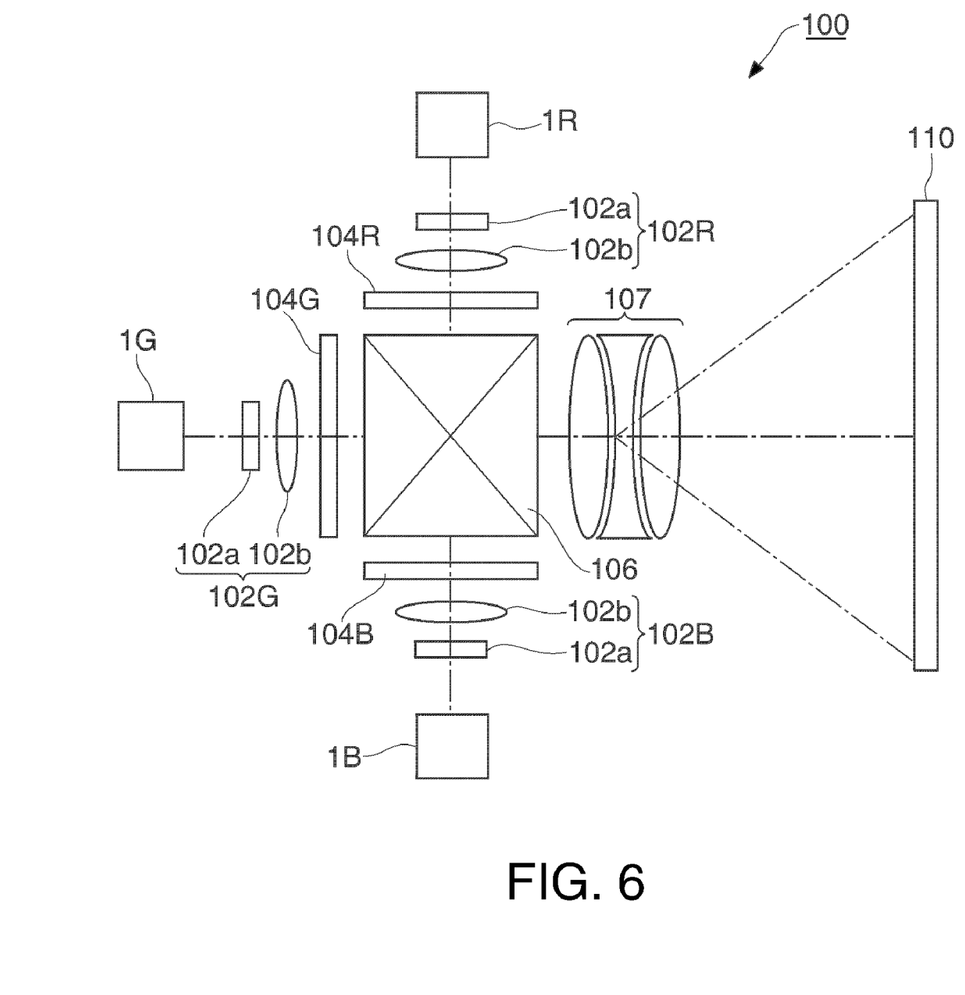
FIG. 6 is a plan view of an image display apparatus according to a fourth embodiment of the invention.

A fourth embodiment of the invention is now described with reference to FIG. 6.

In this embodiment, a projector including the laser beam source device according to the first or second embodiment (including the modified example) is explained. FIG. 6 schematically illustrates the projector in this embodiment.

While the projector including the laser beam source device 1 according to the first embodiment is discussed, the laser beam source device 25 according to the modified example of the first embodiment or the laser beam source device 30 according to the second embodiment may be used.

The projector (image display apparatus) 100 in this embodiment includes a red laser beam source device 1R, green laser beam source device 1G, and the blue laser beam source device 1B for emitting red light, green light, and blue light. Each of these light source devices is constituted by the light source device 1 according to the first embodiment.

The projector 100 includes transmission type liquid crystal light valves (light modulation devices, image forming devices) 104R, 104G, and 104B for modulating the respective color lights emitted from the laser beam source devices 1R, 1G, and 1B, a cross dichroic prism (color combining unit) 106 for combining lights released from the liquid crystal light valves 104R, 104G, and 104B and guides the combined light toward a projection lens 107, and the projection lens (projection unit) 107 for enlarging an image formed by the liquid crystal light valves 104R, 104G, and 104B and projecting the enlarged image to a screen 110.

The projector 100 further includes equalizing systems 102R, 102G, and 102B for equalizing the illuminance distribution of laser beam emitted from the laser beam source devices 1R, 1G, and 1B to illuminate the liquid crystal light valves 104R, 104G, and 104B by the light having equalized illuminance distribution. In this embodiment, each of the equalizing systems 102R, 102G, and 102B is constituted by a hologram 102a and a field lens 102b, for example.

The three color lights modulated by the liquid crystal light valves 104R, 104G, and 104B enter the cross dichroic prism 106. This prism is formed by affixing four rectangular prisms to one another, and a dielectric multilayer film reflecting red light and a dielectric multilayer film reflecting blue light are provided on the inner surface of the cross dichroic prism 106 in X shape. The three color lights are combined by these dielectric multilayer films to form light for displaying a color image. The combined light is projected on the screen 110 by the projection lens 107 which is a projection system to display an enlarged image.

Accordingly, the projector 100 in this embodiment which includes the laser beam source devices 1 according to the first embodiment as the red laser beam source device 1R, the green laser beam source device 1G, and the blue laser beam source device 1B can be made compact and inexpensive, and display bright images.

While the transmission type liquid crystal light valve has been used as the light modulation device, a reflection type light valve or a light modulation device other than liquid crystal type may be used. Examples of these light valves include reflection type liquid crystal light valve, digital micromirror device, and others. The structure of the projection system may be changed according to the types of the light valve to be used.

Fifth Embodiment

A fifth embodiment according to the invention is now described with reference to FIG. 7.

In this embodiment, a scan-type image display apparatus is discussed. FIG. 7 schematically illustrates an image display apparatus in this embodiment.

Figure 7:
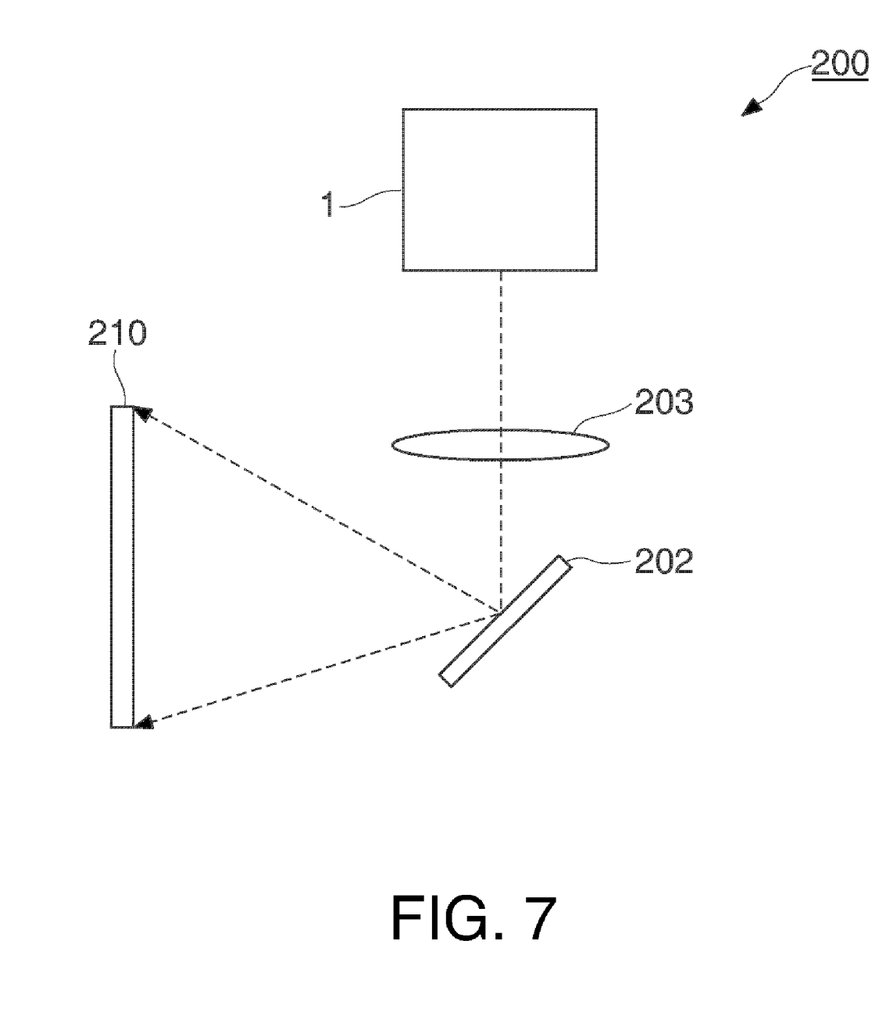
FIG. 7 is a plan view of an image display apparatus according to a fifth embodiment of the invention.

As illustrated in FIG. 7, an image display apparatus 200 in this embodiment includes the laser beam source device 1 according to the first embodiment, an MEMS mirror (scan unit, image forming device) 202 for applying light emitted from the laser beam source device 1 to a screen 210 for scanning, and a convergence lens 203 for converging light emitted from the laser beam source device 1 on the MEMS mirror 202. The light emitted from the laser beam source device 1 is applied to the screen 210 in the horizontal and vertical directions for scanning by driving the MEMS mirror 202. For color image display, a plurality of emitters having red, green, and blue peak wavelengths and constituting laser diode are combined.

While the image display apparatus 200 including the laser beam source device 1 according to the first embodiment has been discussed in this embodiment, the image display device 200 may include the laser beam source device 25 according to the modified example of the first embodiment and the laser beam source device 30 according to the second embodiment may be used.

Sixth Embodiment

A monitoring apparatus 300 including the laser beam source device 1 according to the above embodiment is now described with reference to FIG. 8.

Figure 8:
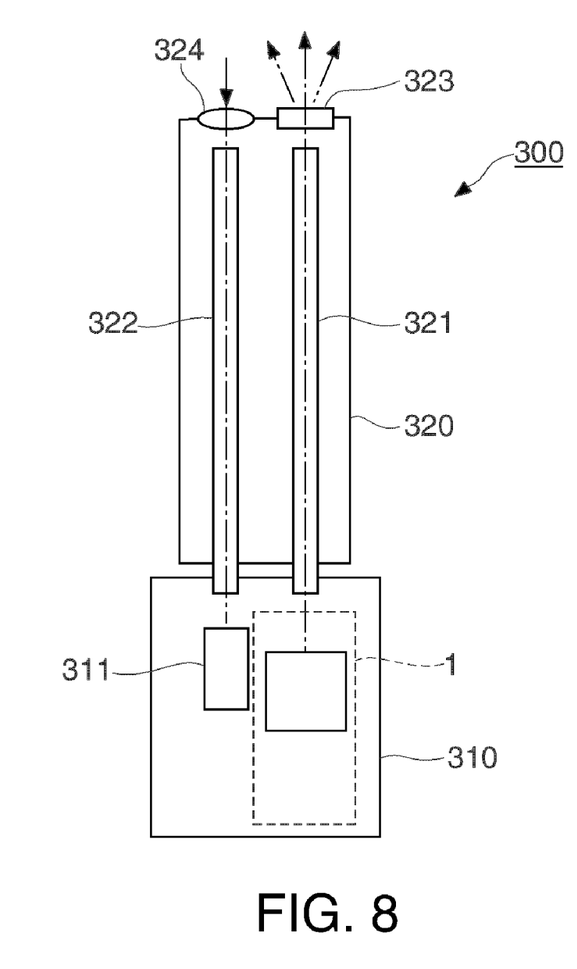
FIG. 8 is a plan view of an image display apparatus according to a sixth embodiment of the invention.

FIG. 8 schematically illustrates the monitoring apparatus according to this embodiment.

As illustrated in FIG. 8, the monitoring apparatus 300 in this embodiment includes a main body 310 and a light transmitting unit 320. The main body 310 includes the laser beam source device 1 according to the first embodiment.

The light transmitting unit 320 has two light guides 321 and 322 on the light sending side and light receiving side. Each of the light guides 321 and 322 is formed by a number of optical fibers, and can transmit laser beam to a distant place. The light source device 1 is disposed on the entrance side of the light guide 321 for sending light, and a diffusion plate 323 is provided on the exit side. The laser beam emitted from the laser beam source device 1 is sent via the light guide 321 to the diffusion plate 323 provided at the end of a light transmitting portion 320, and diffused by the diffusion plate 323 to illuminate a subject.

An image forming lens 324 is disposed at the end of the light transmitting unit 320 to receive reflection light from the subject by the image forming lens 324. The received reflection light is sent to a camera 311 as an image pickup unit disposed within the main body 310 via the light guide 322 on the receiving side. As a result, an image corresponding to the reflection light produced by illuminating the subject using laser beam emitted from the laser beam source device 1 can be obtained by the camera 311.

The monitoring apparatus 300 in this embodiment including the laser beam source device 1 in the first embodiment can be made compact and inexpensive and obtain clear images.

While the monitoring device 300 including the laser beam source device 1 according to the first embodiment has been discussed in this embodiment, the monitoring device 300 may include the laser beam source device 25 according to the modified example of the first embodiment and the laser beam source device 30 according to the second embodiment may be used.

The technical scope of the invention is not limited to the embodiments described and depicted herein. It is thus intended that various modifications and changes may be made without departing from the scope and spirit of the invention.

For example, while the cross dichroic prism has been used as the color combining unit, the color combining unit may be the type which combines color lights by dichroic mirrors disposed in cross shape, or the type which combines color lights by dichroic mirrors disposed in parallel.

According to the embodiments, light having the predetermined conversion wavelength is reflected, and light having wavelength other than the predetermined conversion wavelength is transmitted by the separating unit. However, the structure for separation is not limited to this type.

The entire disclosure of Japanese Patent Application No. 2008-025646, filed Feb. 5, 2008 is expressly incorporated by reference herein.

What is claimed is:

1. A laser beam source device comprising:
   a light source which emits light having fundamental wavelength;
   a wavelength conversion element which receives the light having fundamental wavelength and emitted from the light source and converts at least a part of the received light into light having predetermined conversion wavelength;
   a resonance element which transmits first light converted into the predetermined conversion wavelength light and reflects light not converted into the predetermined conversion wavelength toward the wavelength conversion element;
   an optical path conversion element which releases second light contained in the light reflected by the resonance element and converted into the predetermined conversion wavelength light by passing through the wavelength conversion element substantially in the same direction as the direction of the first light transmitted through the resonance element, and releases the light not converted into the predetermined conversion wavelength light toward the light source; and a supporting member which supports the wavelength conversion element, the resonance element, and the optical path conversion element on one end surface of the supporting member, wherein the resonance element is disposed in such a position that one end surface of the resonance element on the second light side is shifted to the supporting member from one end surface of the wavelength conversion element on the second light side.

2. The laser beam source device according to claim 1, wherein the optical path conversion element includes:

a separating unit disposed between the light source and the wavelength conversion element on the optical path to release the second light contained in the light reflected by the resonance element in a direction different from the direction toward the light source, and release the remaining light not converted into the predetermined conversion wavelength light toward the light source; and a reflecting unit which reflects the second light released from the separating unit substantially in the same direction as the direction of the first light transmitted through the resonance element.

3. The laser beam source device according to claim 2, wherein the wavelength conversion element is disposed in such a position that the one end surface of the wavelength conversion element is shifted to the supporting member from the end portion of the separating unit closest to the light source.

4. The laser beam source device according to claim 1, wherein the areas on the end surfaces of the optical path conversion element, the wavelength conversion element, and the resonance element for receiving light emitted from the light source decrease in the order of optical path conversion element, the wavelength conversion element, and the resonance element.

5. The laser beam source device according to claim 2, further comprising:

a wavelength selection element disposed between the optical path conversion element and the wavelength conversion element on the optical path to transmit light contained in the light released from the optical path conversion element and having predetermined selection wavelength, wherein the wavelength selection element is disposed in such a position that one end surface of the wavelength selection element is shifted to the supporting member from the end portion of the separating unit closest to the light source.

6. A lighting device comprising:

the laser beam source device according to claim 1; and a diffusion optical member disposed in the traveling direction of laser beam emitted from the laser beam source device.

7. An image display apparatus, comprising:

the laser beam source device according to claim 1; and an image forming device which displays an image having desired size on a display surface by using light emitted from the laser beam source device.

8. A monitoring apparatus comprising:

the laser beam source device according to claim 1; and an image pickup unit which shoots an image of a subject by using laser beam emitted from the laser beam source device.

* * * * *